US012660639B2

(12) United States Patent
Lau et al.

(10) Patent No.: US 12,660,639 B2
(45) Date of Patent: Jun. 16, 2026

(54) QUAD FLAT NO-LEAD (QFN) MANUFACTURING PROCESS

(71) Applicant: Texas Instruments Incorporated, Dallas, TX (US)

(72) Inventors: Hong Seng Lau, Kuala Lumpur (MY); Wai Kong Soo, Selangor (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 828 days.

(21) Appl. No.: 17/180,553

(22) Filed: Feb. 19, 2021

(65) Prior Publication Data

US 2022/0270957 A1     Aug. 25, 2022

(51) Int. Cl.
| | |
|---|---|
| *H10P 54/00* | (2026.01) |
| *H10W 70/40* | (2026.01) |
| *H10W 74/01* | (2026.01) |
| *H10W 74/10* | (2026.01) |

(52) U.S. Cl.
CPC ........... *H10W 70/424* (2026.01); *H10P 54/00* (2026.01); *H10W 74/014* (2026.01); *H10W 74/111* (2026.01)

(58) Field of Classification Search
CPC ......................... H01L 23/49548; H01L 21/78; H01L 23/3107
See application file for complete search history.

(56) References Cited

U.S. PATENT DOCUMENTS

| | | | |
|---|---|---|---|
| 9,184,120 B1 * | 11/2015 | Babaran | ............ H01L 23/49582 |
| 2006/0186514 A1 * | 8/2006 | Shim | .................. H01L 23/49548 |
| | | | 257/E25.023 |
| 2018/0033647 A1 | 2/2018 | Bin Mohd Arshad et al. | |

FOREIGN PATENT DOCUMENTS

| | | | | |
|---|---|---|---|---|
| JP | 2016040407 | * | 3/2016 | |
| WO | WO-2007005639 A2 | * | 1/2007 | ......... H01L 21/4821 |

* cited by examiner

*Primary Examiner* — Mohammad M Choudhry
(74) *Attorney, Agent, or Firm* — Ronald O. Neerings; Frank D. Cimino

(57)     ABSTRACT

A lead frame includes a metal structure having opposite first and second sides and prospective device portions having leads with first and second lateral sides extending from a tie bar toward a die attach pad. One or more of the leads includes a first indent in the first lateral side that extends to the first side of the metal structure, and a second indent that extends to the second side of the metal to reduce saw blade loading and mitigate saw burr and lead smear during package singulation. A packaged electronic device includes a package structure, a semiconductor die enclosed by the package structure, and leads having a first side, a second side, and first and second lateral sides, where the leads include a first indent in the first lateral side that extends to the first side, and a second indent that extends to the second side of the lead.

25 Claims, 13 Drawing Sheets

QUAD FLAT NO-LEAD (QFN) MANUFACTURING PROCESS

BACKGROUND

Quad flat no-lead (QFN) packages and other package types have conductive leads disposed along one or more lateral sides, with portions of the leads exposed along the package bottom to allow soldering to a host printed circuit board (PCB). The leads are spaced from one another to satisfy performance specifications for signal isolation and voltage withstand capability. During manufacturing, the leads are sawed to separate packaged devices from a starting lead frame structure. The sawing operation, however, can heat the lead frame metal, leading to material deformation of ductile copper and formation of burrs and/or lead smearing. These defects can shorten the spacing distance between adjacent leads in the finished product, leading to unacceptable voltage withstand ratings or even short circuits. These problems can be addressed by use of hybrid saw blades, such as a combination of resin and metal to facilitate heat dispersion during saw singulation and reduce saw burr generation, but this increases production tooling costs. Another approach involves using nozzles designed to introduce low temperature cutting water to cool the saw blade and the cutting point area to maintain a good sawing environment to reduce saw burr generation, but this also increases cost and complexity. A further approach is to reduce the thickness of the copper lead frame, but this can inhibit electrical and/or structural product performance of the finished devices.

SUMMARY

In one aspect, a lead frame includes a metal structure having a first side, an opposite second side, and prospective device portions, with tie bars joining the device portions. The respective device portions include a die attach pad connected to one of the tie bars, and leads spaced apart from the die attach pad. The respective leads have opposite first and second lateral sides, in which the first and second sides extend from one of the tie bars toward the die attach pad parallel to one of a first direction or a second direction. One or more of the leads includes a first indent in the first lateral side that extends to the first side of the metal structure, and a second indent that extends to the second side of the metal structure.

In another aspect, a method includes, performing a die attach process that attaches semiconductor dies to respective die attach pads of device portions of a lead frame, performing an electrical connection process that electrically couples a lead portion of respective device portions of the lead frame to a conductive feature of the respective semiconductor dies, and performing a molding process that encloses the semiconductor dies in a package structure. The method also includes performing a package separation process that separates individual packaged electronic devices from one another. The package separation process includes a saw cutting process that cuts through portions of the package structure and lead portions of the respective device portions along a cut direction that causes a cutting saw blade to approach a first lateral side of respective lead portions and to depart an opposite second lateral side of the respective lead portions, in which the first lateral side of the respective lead portions includes a first indent along a bottom side of the respective packaged electronic device, and the second lateral side of the respective lead portions includes a second indent spaced apart from the bottom side of the respective packaged electronic device.

In another aspect, a packaged electronic device includes a package structure having a first side, a second side, and opposite first and second lateral sides, as well as a semiconductor die enclosed by the package structure, and leads exposed along the first and second lateral sides. The respective leads have a first side, a second side, a first lateral side and an opposite second lateral side. One or more of the leads includes a first indent in the first lateral side that extends to the first side of the first one of the leads, and a second indent that extends to the second side of the first one of the leads.

DETAILED DESCRIPTION

Figure 1:
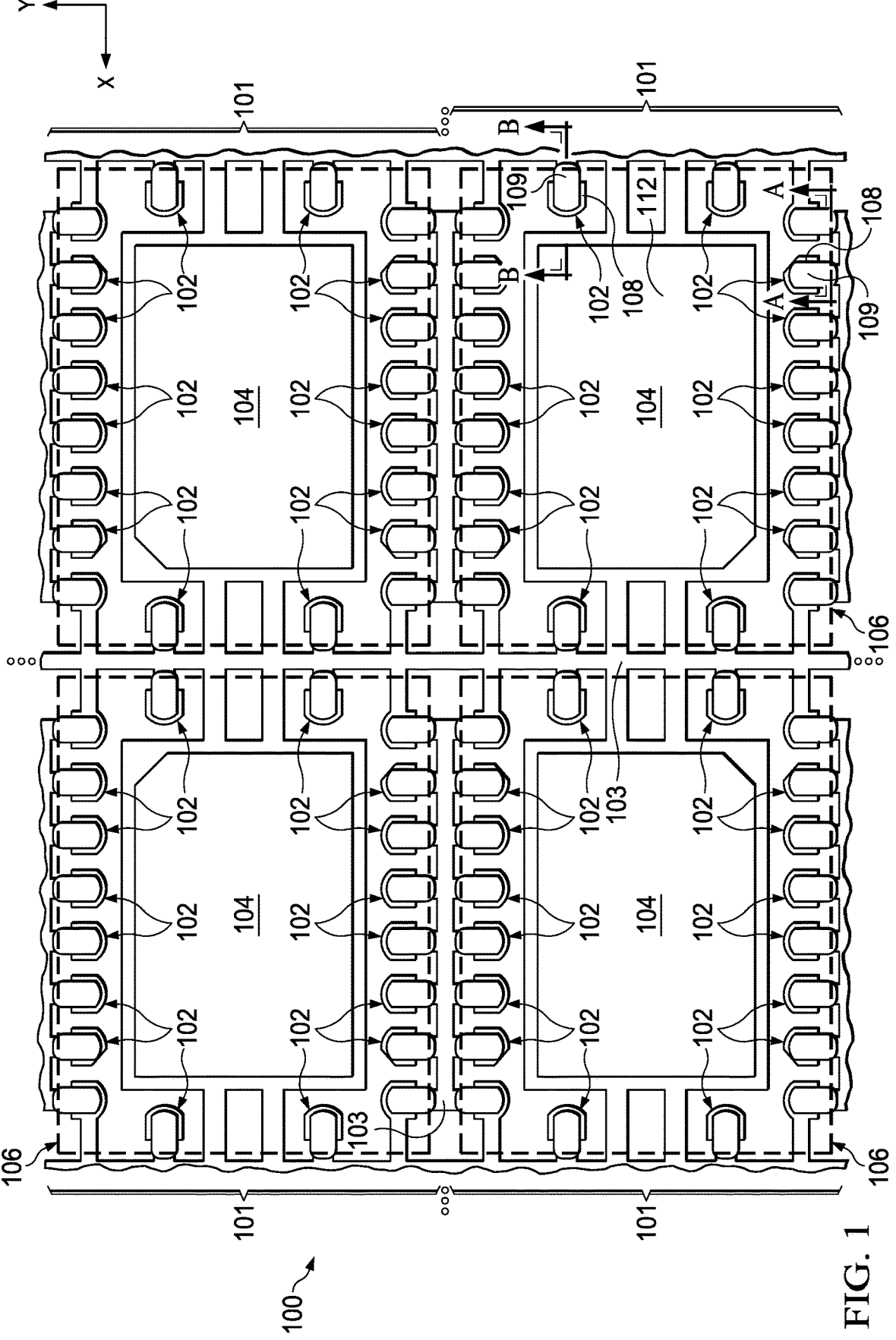
FIG. 1 is a partial bottom plan view of a lead frame according to an embodiment.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Referring initially to FIGS. 1, 1A, 1B and 1C, FIG. 1 shows a partial bottom view of a lead frame 100 formed as a panel or strip that includes a metal structure, such as copper, with prospective device portions 101 arranged in rows along a first direction (e.g., the X direction in FIG. 1), as well as columns along a second direction (e.g., the Y direction in FIG. 1). The first and second directions are perpendicular to one another. The metal structure include leads 102, tie bars 103 and die attach pads 104. The individual device portions 101 in the illustrated example include a die attach pad 104 connected to one or more of the tie bars 103, as well as leads 102 that are spaced apart from the die attach pad 104, and the tie bars 103 join the device portions 101 in a unitary starting metal structure of the lead frame 100. The leads 102 and the die attach pad 104 in the starting lead frame 100 are subsequently separated from the tie bars 103 by a saw cutting process as described further below. FIG. 1 also shows prospective package structure regions 106 in dashed lines, indicating the extent of ultimately singulated packaged electronic devices fabricated using the starting lead frame 100. The leads 102 and the die attach pads 104 in the illustrated lead frame 100 include half-etched ledge features 108 and thicker features 109 as further shown in the side views of FIGS. 1A, 1B and 1C.

In one example, the lead frame 100 is created using a starting sheet or strip of copper, aluminum or other suitable metal having a top or first side 111 and a bottom or second side 112, and the various features of the metal structure are stamped or patterned using a punch press to form the lead portions 102, the tie bars 103 and the die attach pads 104. A subsequent masked etch process is used to form recesses including the half-etched ledge features 108 and thicker features 109. The half-etched ledge features 108 of the leads in one example have a minimum thickness along the second (Y) direction that is approximately half the thickness of the thicker features 109, although not a requirement of all possible implementations. As further shown in FIG. 1B, the half-etched ledge features 108 in some areas have curved edges, although not a requirement of all possible implementations.

Figures 1A, 1B:
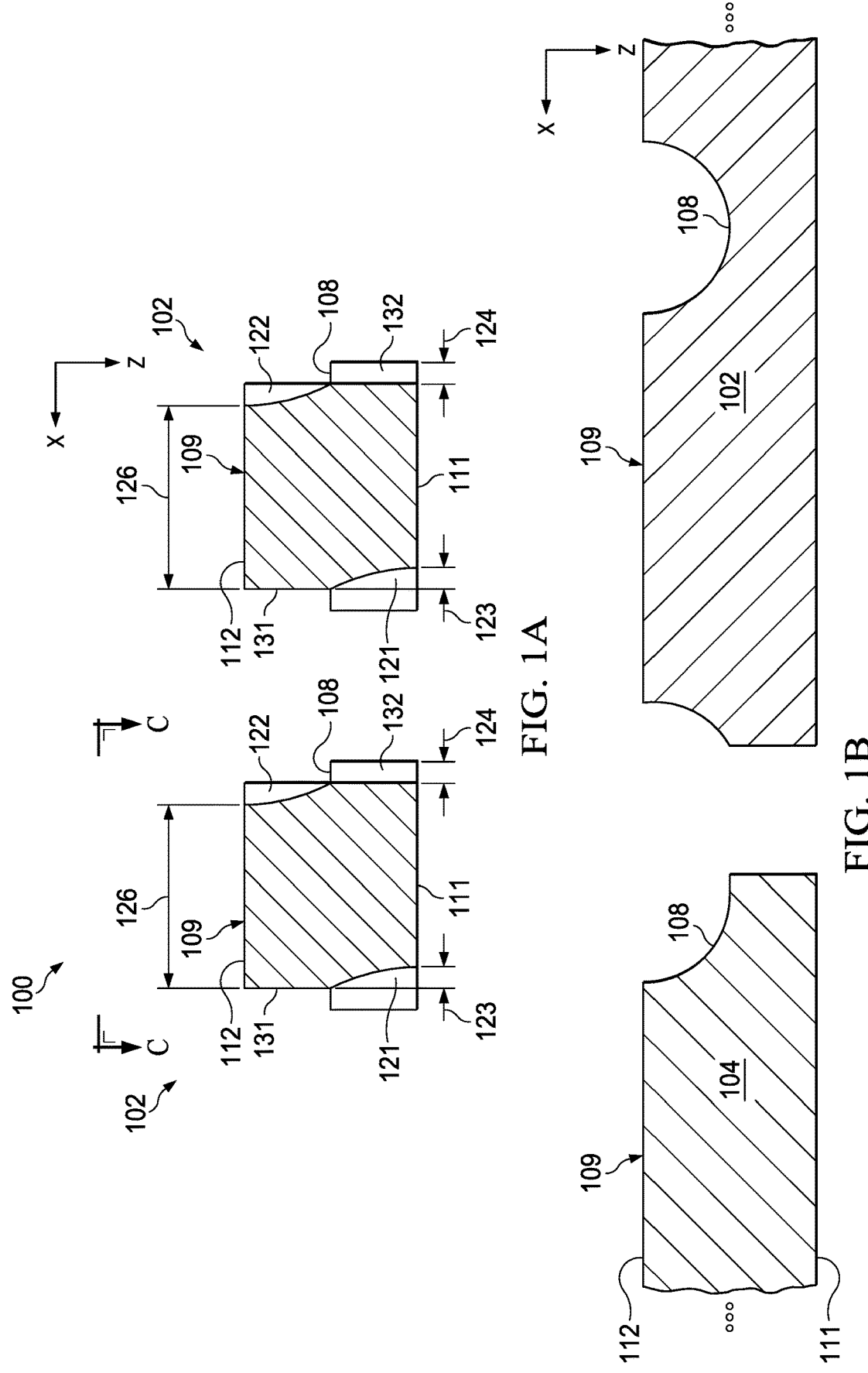
FIG. 1A is a partial sectional side view of the lead frame taken along line A-A in FIG. 1.
FIG. 1B is a partial sectional side elevation view of the lead frame taken along line B-B in FIG. 1.

As best shown in FIG. 1A, one or more of the leads 102 include a first indent 121 that extends to the first side 111 of the metal structure, and a second indent 122 that extends to the second side 112 of the metal structure. In one example, the first indents 121 have a lateral width 123 and the second indents 122 have a lateral width 124 In one example, the lateral widths 123 and 124 are approximately equal, such as about 25 μm, although not a requirement of all possible implementations. In another example, the lateral widths 123 and 124 are different. The individual leads 102 have an upper width 126, for example, about 240 μm. In the illustrated example, all the leads 102 include first and second indents 121 and 122 as generally shown in FIG. 1A. In another implementation, one or more leads 102 include the first and second indents 121 and 122, and other leads have one or no indents (not shown). In another example, one or more of the leads 102 include only the first indent 121 or only the second indent 122.

Figure 1C:
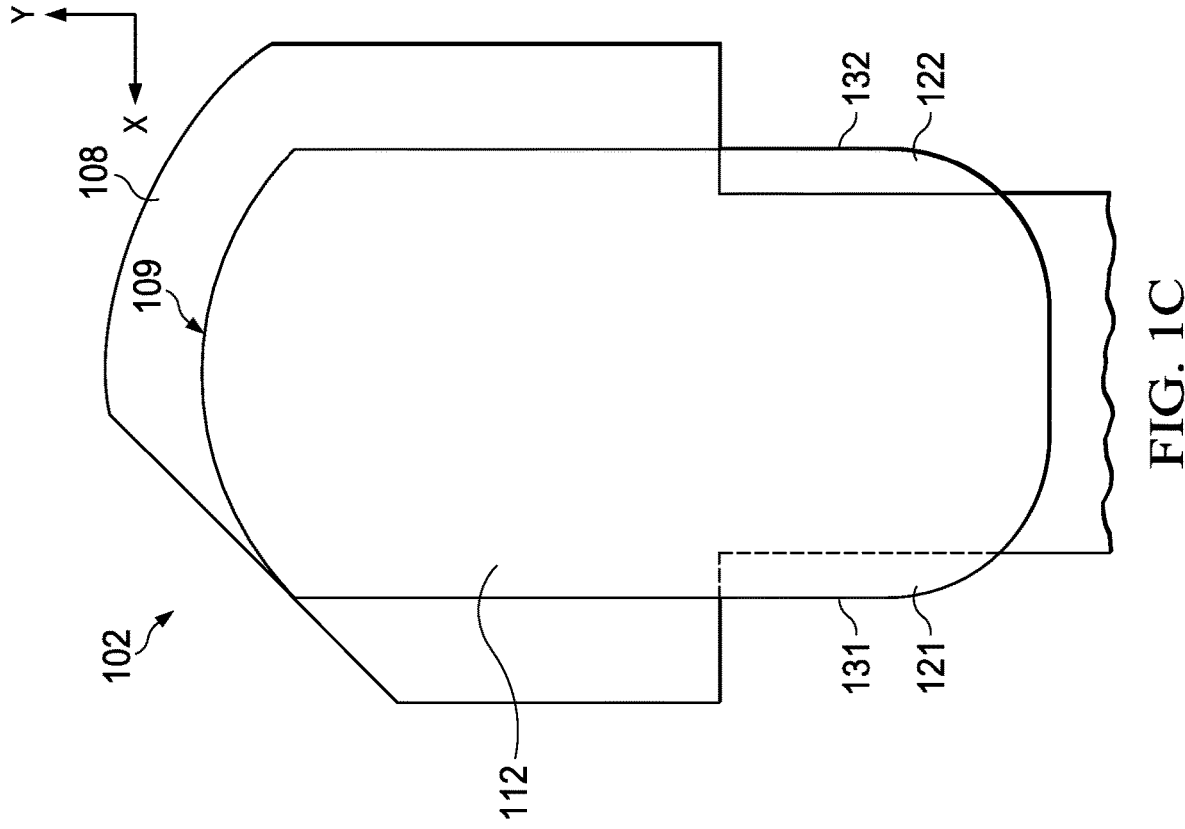
FIG. 1C is a partial sectional side elevation view of the lead frame taken along line C-C in FIG. 1A.

As shown in FIGS. 1A and 1C, the respective leads 102 have a first lateral side 131 and an opposite second lateral side 132. In the illustrated example, the individual device portions 101 have leads 102 laterally outward of all four lateral sides of the die attach pad 104 for fabricating QFN integrated circuit (IC) electronic devices. A first pair of lead rows includes leads 102 spaced from one another along the first direction X on first and second laterally opposite sides. A second set of lead rows includes leads 102 spaced from one another along the second direction Y on third and fourth opposite lateral sides. The respective first and second sides 131 and 132 of individual leads 102 in this example extend from one of the tie bars 103 toward the die attach pad 104 parallel to one of the first and second directions X or Y in FIG. 1. In other examples, individual device portions 101 have leads 102 laterally outward of less than four of the lateral sides of the die attach pad 104. Other implementations are possible having only a single lead 102 on a particular side and/or one or more sides with no leads 102.

FIG. 1A shows a partial cross-section along line A-A of two adjacent leads 102 spaced from one another along the first direction X. Each of the illustrated leads 102 in this example have a first indent 121 in the first lateral side 131 that extends to the top or first side 111 of the metal structure, as well as a second indent 122 in the second lateral side 132 that extends to the bottom or second side 112 of the metal structure. The example leads 102 in FIG. 1A also include half-etched step or ledge features 108 spaced from and between the first side 111 and the second side 112 of the metal structure as well as full thickness portions 109.

The individual device portions 101 in FIG. 1 have leads 102 laterally outward of all four lateral sides of the die attach pad 104 for fabricating QFN integrated circuit (IC) electronic devices. In the illustrated example, all the leads 102 on all sides of the respective device portions 101 have the illustrated first and second indents 121 and 122. The first indent 121 of one lead 102 faces the second indent 122 of an adjacent lead 102 and vice versa. In practice, this configuration facilitates reduced likelihood and extent of lead smearing and saw burr generation during package separation, as illustrated and described further below in connection with FIGS. 7, 7A, 8, 8A and 9. The first indent 121 extends from the first side 111 of the metal structure and ends before the second side 112 as shown in FIG. 1A. The second indent 122 extends from the second side 112 and ends before the first side 111 of the metal structure. In the example of FIG. 1A, the first indent 121 has a curved, tapered profile and the second indent 122 has a tapered curved profile. In one example, the curvature of the curved portions of the indents 121 and 122 are the same or similar. In other examples, the curvature of the curved portions of the indents 121 and 122 are different. Other profiles and shapes are possible, examples of which are shown in FIGS. 10-12 below.

Figure 2:
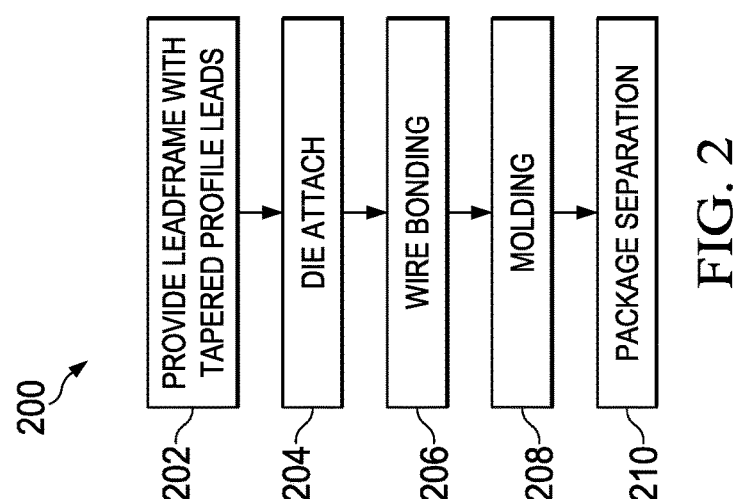
FIG. 2 is a flow diagram of a method according to another embodiment.
Figure 3:
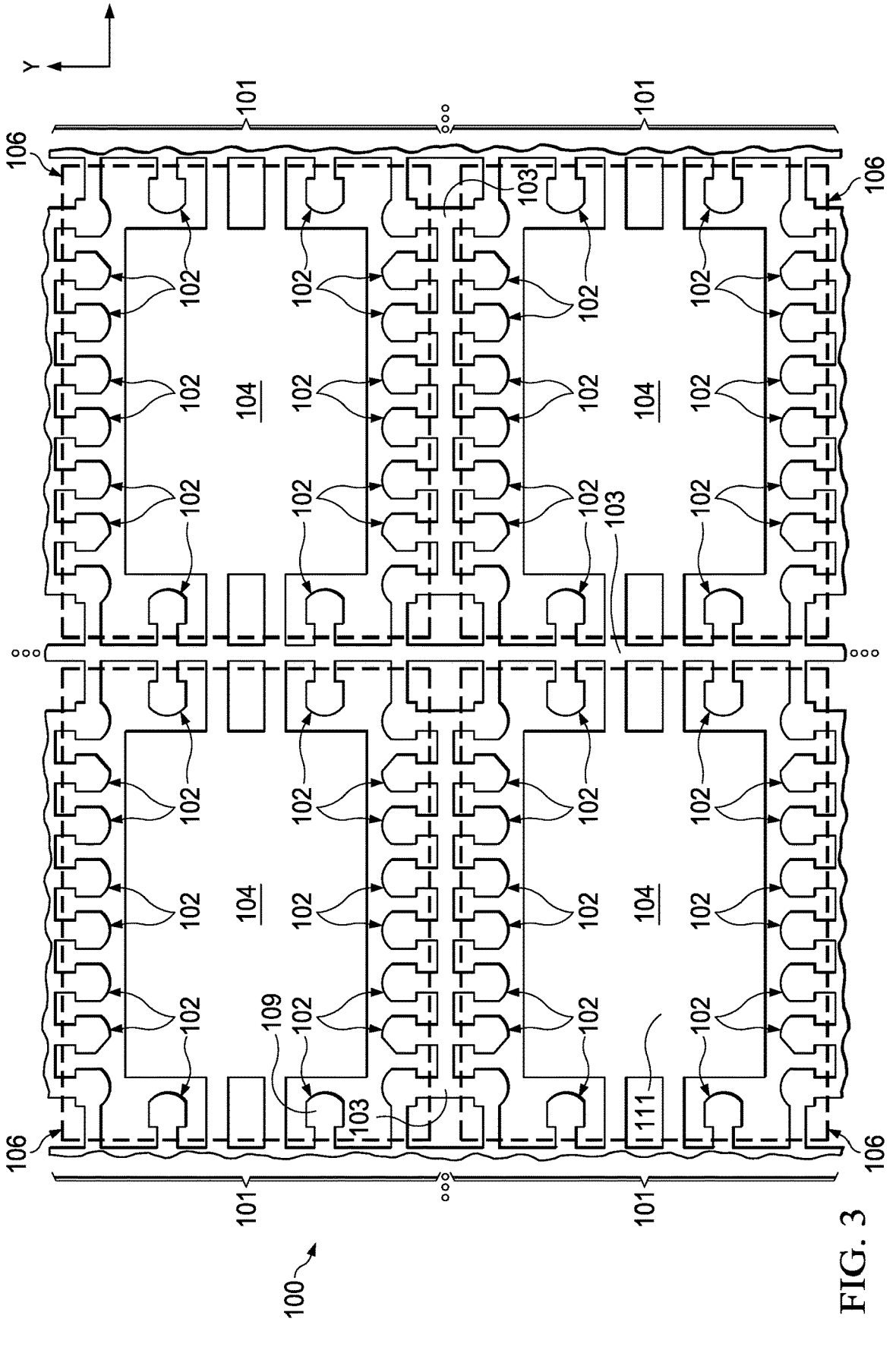
FIG. 3 is a partial top plan view of the lead frame of FIG. 1.

FIG. 2 shows an electronic device fabrication method 200. The method 200 includes providing a lead frame at 202 having tapered profile leads. FIG. 3 shows a partial top view of the lead frame 100, rotated about an axis along the Y direction relative to the orientation of FIG. 1. The lead frame 100 in one example is a copper structure formed by suitable stamping operations and etch processing to form the leads 102, the tie bars 103, the die attach pads 104 and undercut features, such as the half-etched ledge features 108 in FIGS. 1 and 1A-1C to facilitate adhesion of subsequently formed molding compound and prevent mold delamination. The tie bars 103 can include support arms that support the die attach pad 104 and/or the leads 102. Such support arm or arms can be connected to portions of the lead frame 100 to support the die attach pad 301 during and after manufacturing or can be removed during manufacturing. In another example, the die attach pads 104 are supported relative to the lead frame 100 using an adhesive carrier or tape (not shown) during portions of the manufacturing process.

Figure 4:
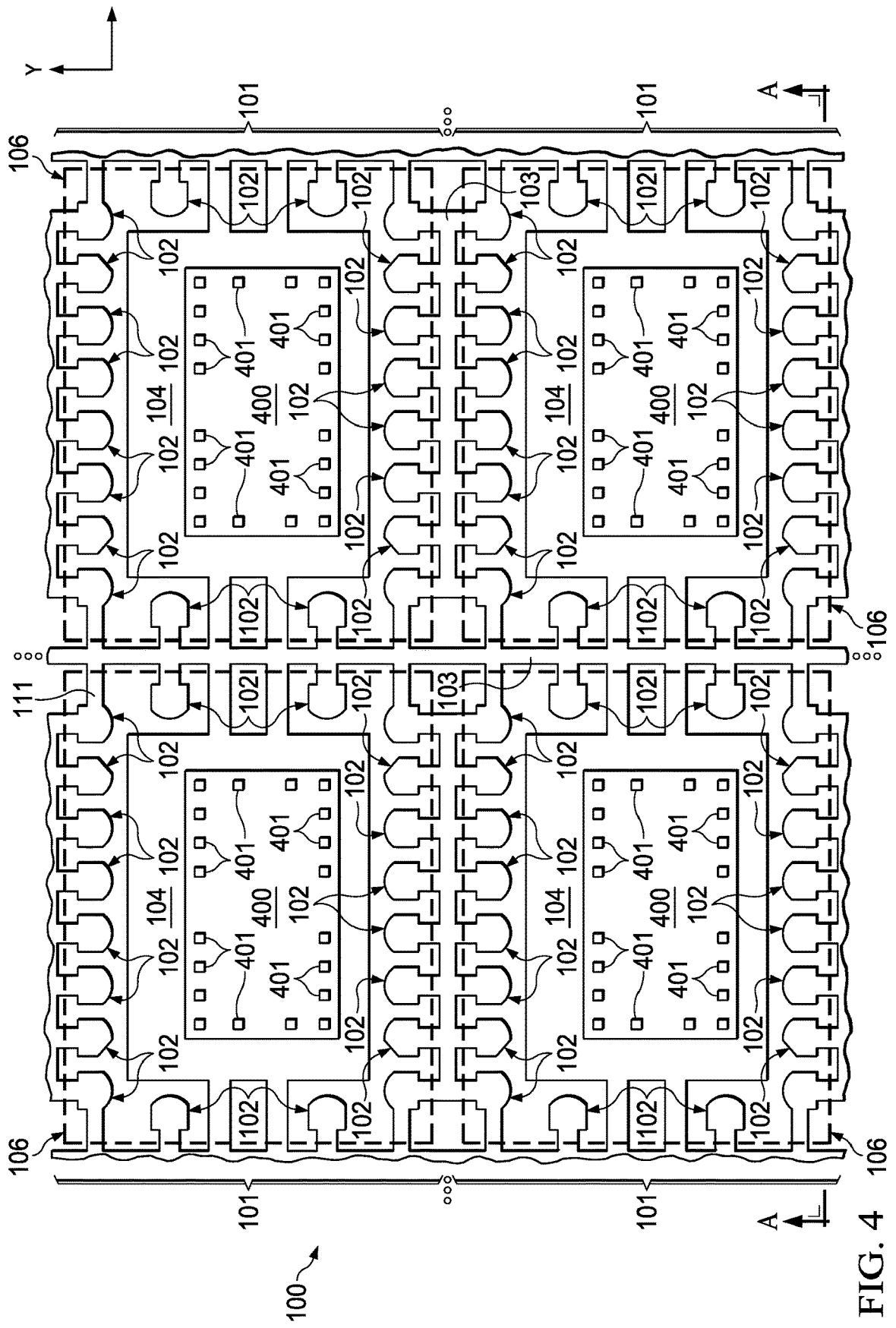
FIG. 4 is a partial top plan view of the lead frame of FIG. 3 with semiconductor dies attached to die attach pads of the lead frame.
Figures 4A, 5A:
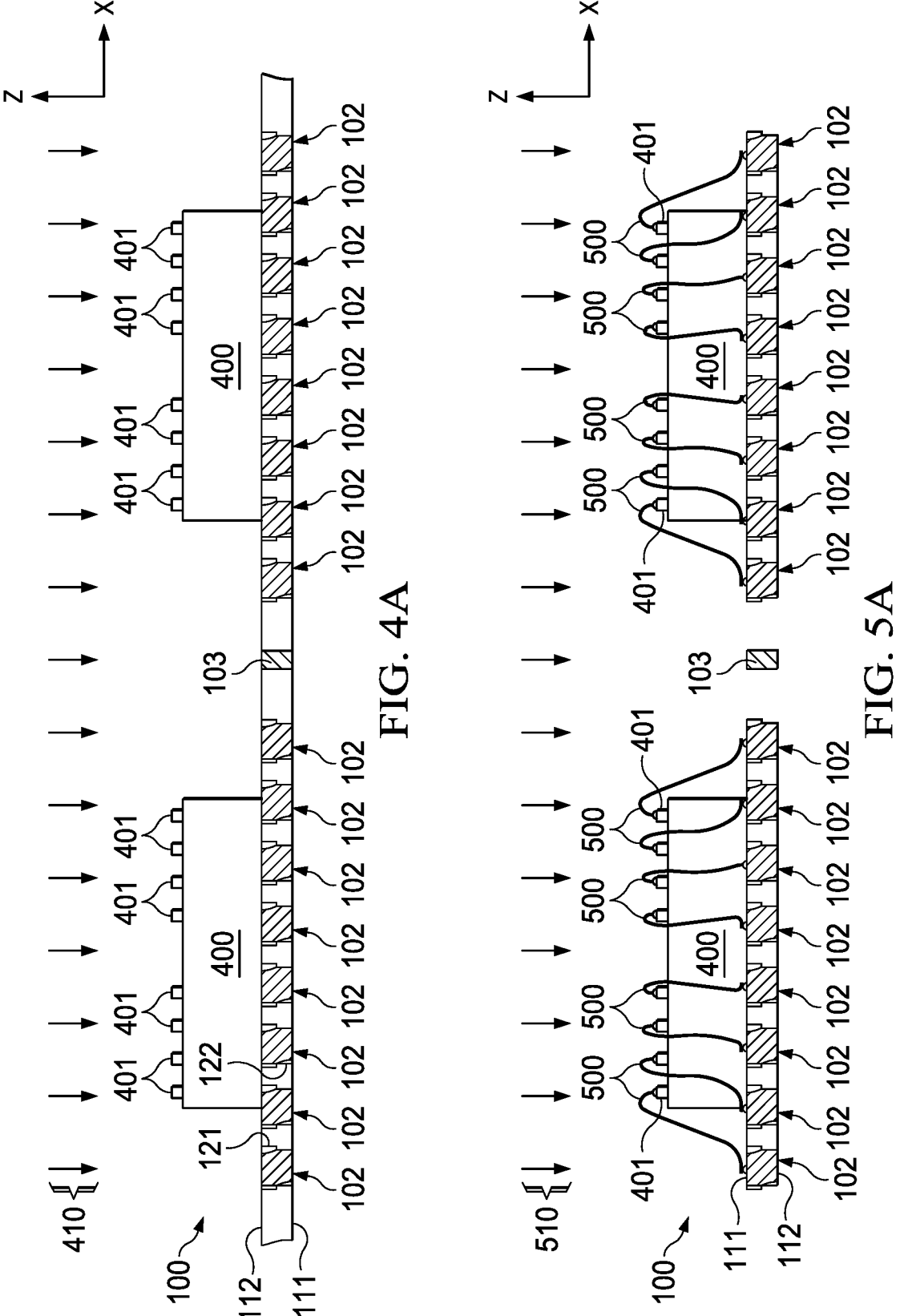
FIG. 4A is a partial sectional side elevation view of the lead frame taken along line A-A in FIG. 4 undergoing a die attach process.
FIG. 5A is a partial sectional side elevation view of the lead frame taken along line A-A in FIG. 5 undergoing a wire bonding process.

The method 200 continues at 204 in FIG. 2 with die attach processing. FIG. 4 shows a partial top plan view of the lead frame of FIG. 3 with semiconductor dies 400 (e.g., a semiconductor chip singulated or separated from a starting wafer, not shown) attached to the die attach pads 104 of the lead frame 100. FIG. 4A shows a side view of the lead frame 100 taken along line A-A in FIG. 4 undergoing a die attach process 410 that attaches the semiconductor dies 400 to respective die attach pads 104 of the individual device portions 101 of the lead frame 100. The semiconductor dies 400 have a top side with conductive features 401 (e.g., copper bond pads) for electrical coupling to respective ones of the leads 102. FIGS. 4 and 4A show one example in which a single semiconductor die 400 is attached to the die attach pad 104 in the individual device portions 101 of the lead frame 100. In other examples, multiple dies can be attached to corresponding die attach pads, and other circuit components can be similarly attached to corresponding die attach pads, such as laminated magnetic circuit components (not shown). The die attachment at 204 is performed in one example using suitable adhesive attachment materials or soldering.

Figure 5:
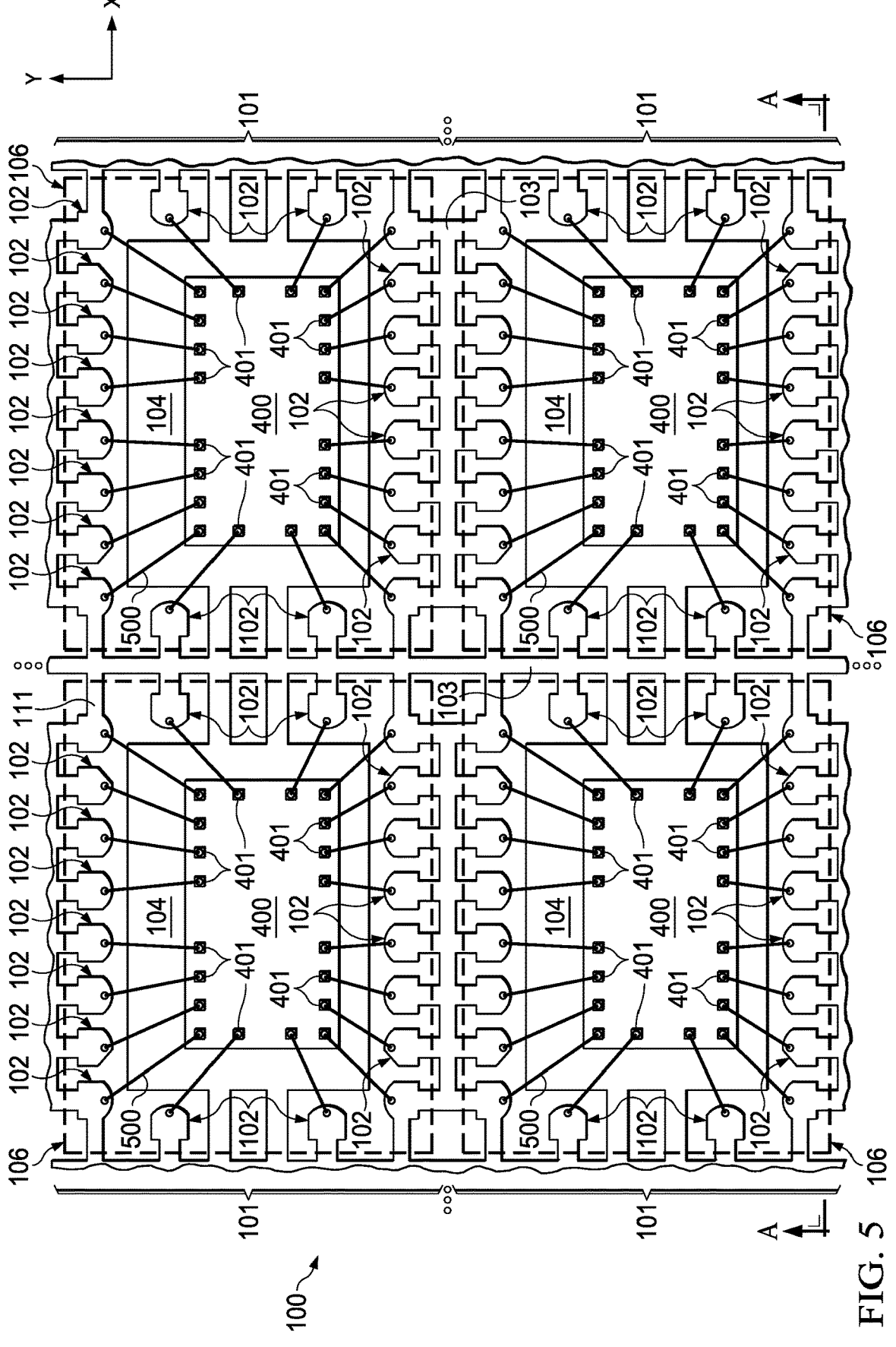
FIG. 5 is a partial top plan view of the lead frame with bond wires coupling conductive features of the semiconductor dies to lead portions of the lead frame.

The method 200 continues at 206 in FIG. 2 with wire bonding. FIGS. 5 and 5A show one example, in which the lead frame 100 and the attached semiconductor dies 400 undergo an electrical connection process 510 that electrically couples lead portions 102 of respective device portions 101 of the lead frame 100 to respective conductive features 401 of the semiconductor dies 400. The illustrated process 510 is a wirebonding process that makes electrical connections by bond wires 500 between the conductive features 401 of the semiconductor dies 400 and respective lead portions 102 of the starting lead frame 100. The bond wires 500 each include a first end connected (e.g., soldered or ultrasonically welded) to a corresponding conductive feature 401 of the semiconductor die 400, as well as a second end connected (e.g., soldered or ultrasonically welded) to the first lead portion 102. In another example, the electrical connection processing at 206 includes flip-chip die attach techniques to electrically couple given ones of the conductive feature 401 of the semiconductor die 400 to respective leads 102, alone or in combination with wire bonding processing.

Figure 6:
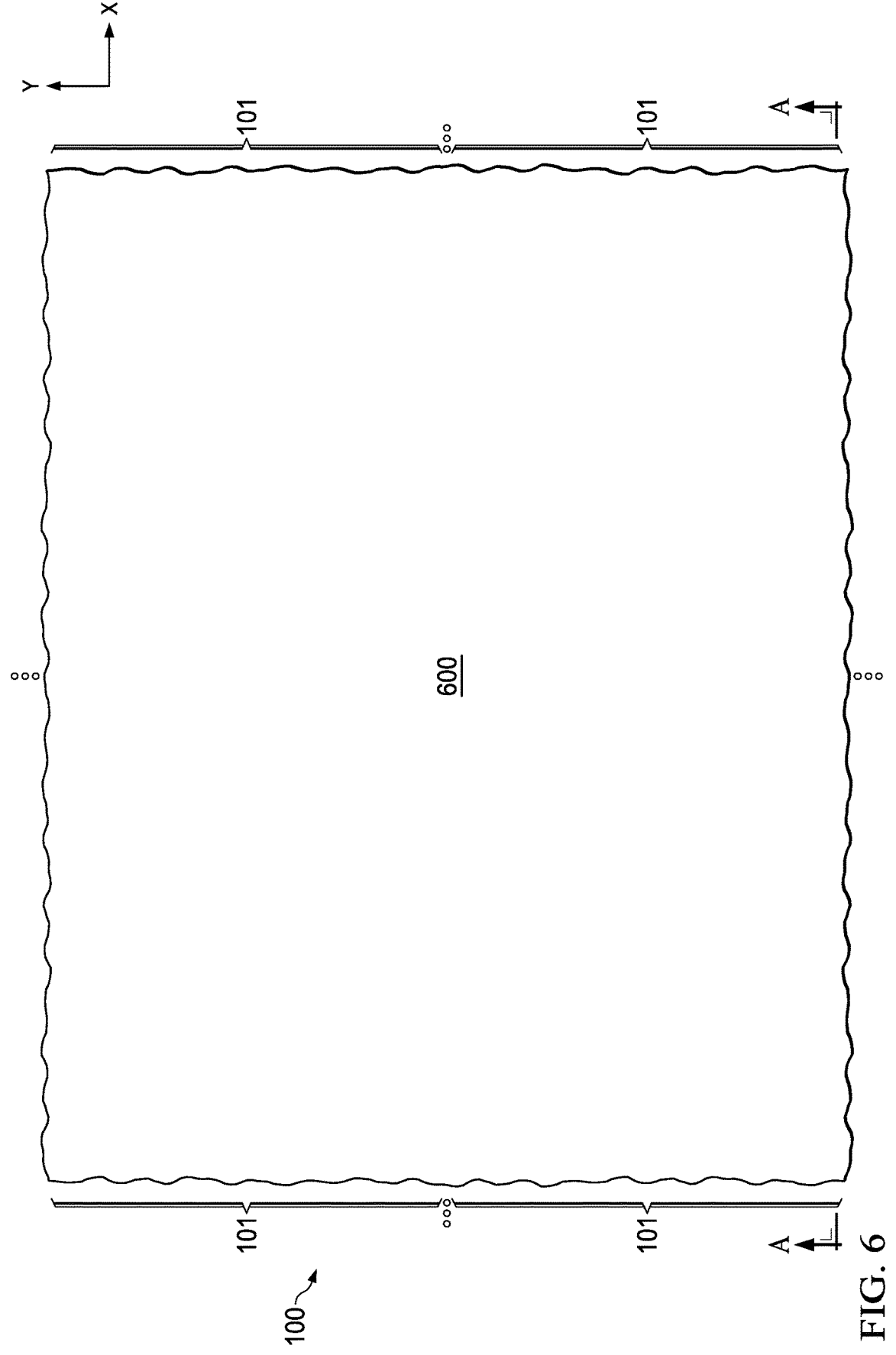
FIG. 6 is a partial top plan view of the lead frame with molded structures.
Figures 6A, 7A:
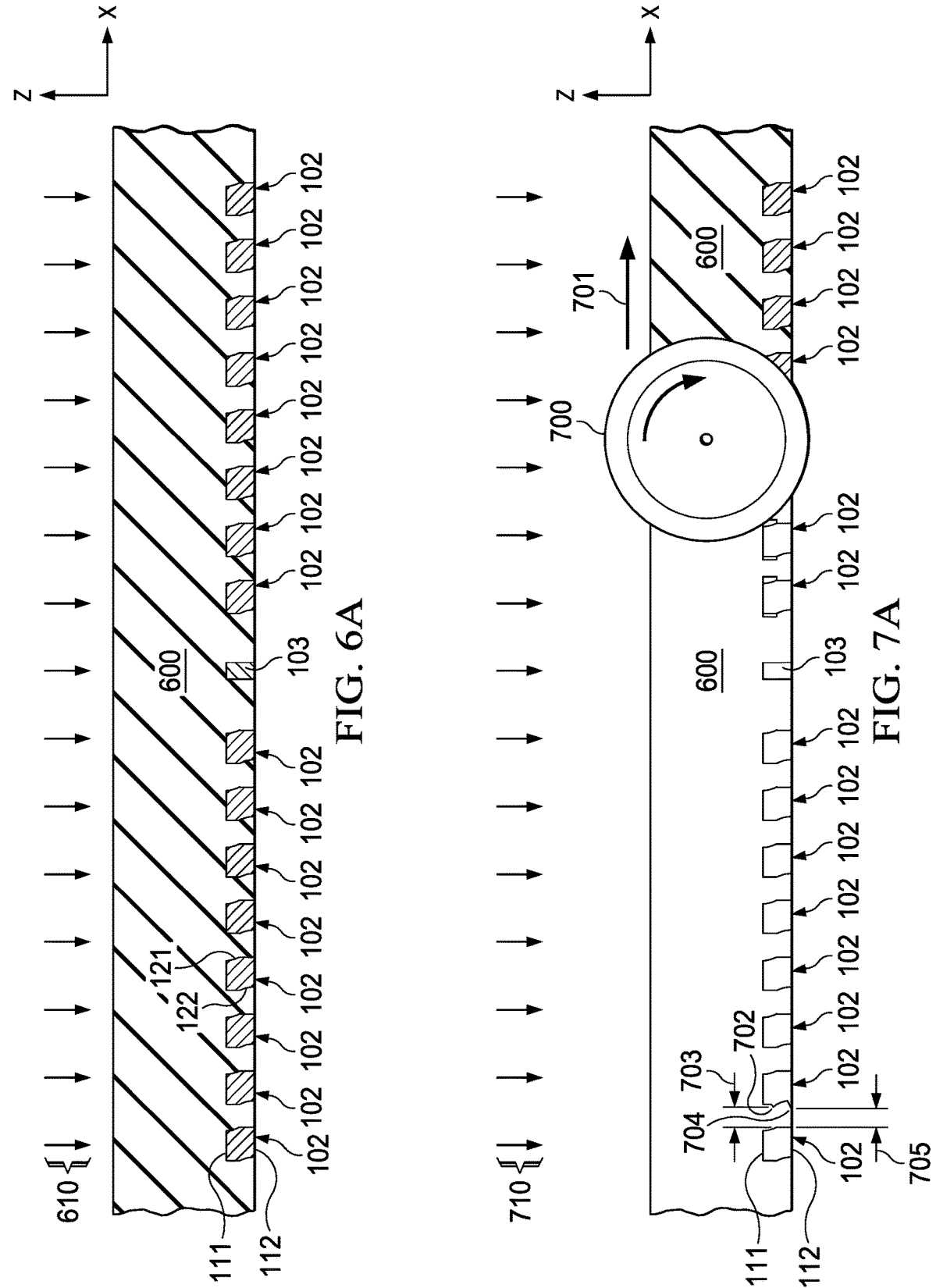
FIG. 6A is a partial sectional side elevation view of the lead frame taken along line A-A in FIG. 6 undergoing a molding process.
FIG. 7A is a partial sectional side elevation view of the lead frame taken along line A-A in FIG. 7 undergoing a saw cutting process along the first direction.
Figure 7:
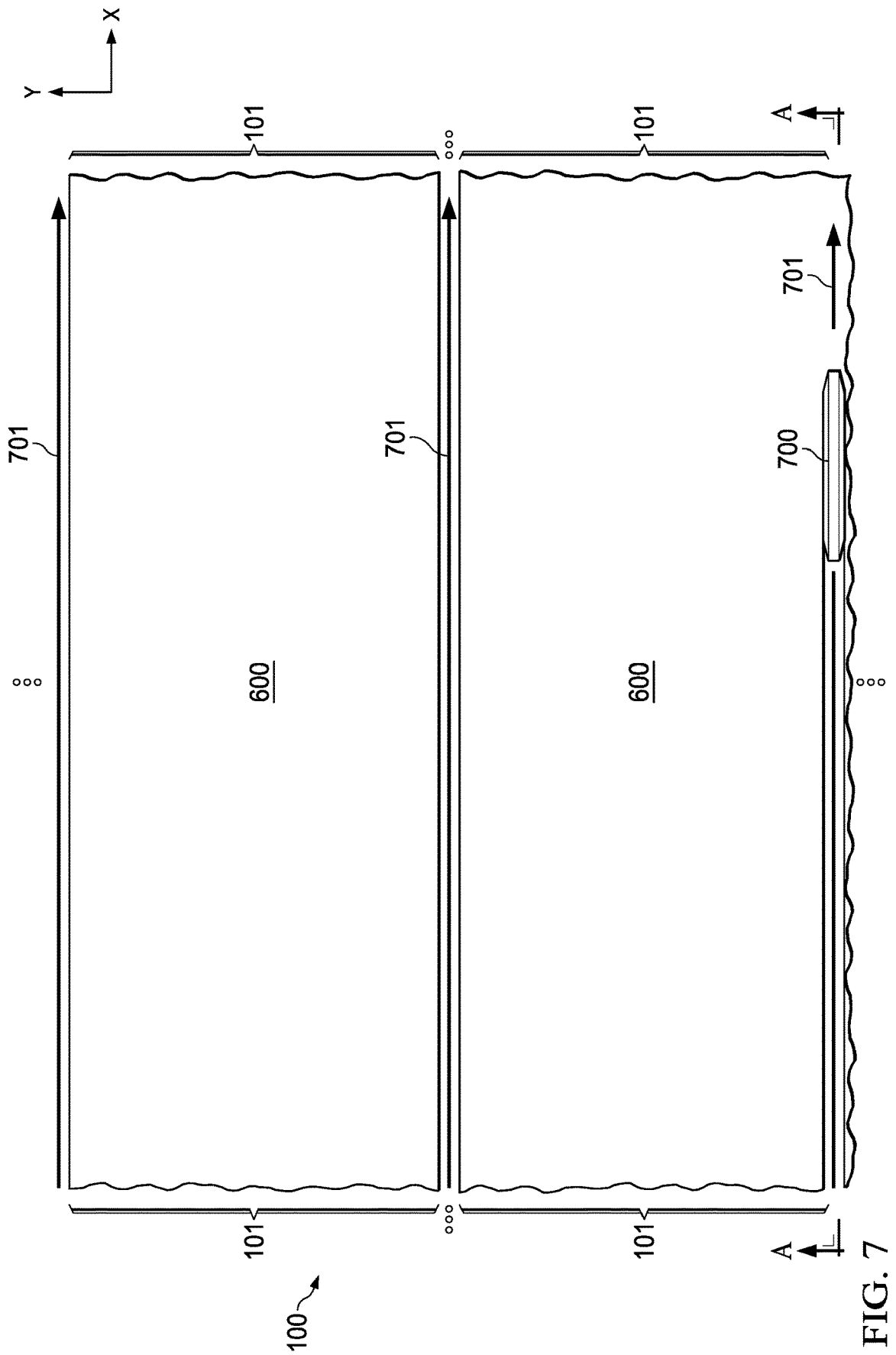
FIG. 7 is a partial top plan view of the lead frame with a package separation saw cutting portions of the molded structures and tie bar and lead features of the lead frame along a first direction.

At 208 in FIG. 2, the semiconductor dies 400, the die attach pads 104, the bond wires 500 and portions of the lead features 102 and the tie bar features 103 are enclosed in a molded package structure 600 using a mold having one or more cavities (not shown). FIGS. 6 and 6A show the lead frame 100 undergoing a molding process 610 that encloses the semiconductor dies 400 of the respective device portions 101 in the package structure 600. In one example, the process 610 forms multiple molded package structures 600, including a molded structure 600 for respective device portions 101. In the illustrated example, the molding process 610 forms a single molded structure that covers and encloses all the device portions 101. In another example, the molding process 610 creates a single molded structure for each row or for each column of device portions 101. The concepts of the present disclosure can be used in examples that employ cavity molding as well as in other examples that use panel molding techniques and processes.

The method 200 continues at 210 in FIG. 2 with package separation or singulation. FIGS. 7, 7A, 8 and 8A show one example that includes performing a package separation process 710, 810 that separates individual packaged electronic devices 800 from one another. The package separation process uses a rotating cutting saw blade 700. The package separation process in one example includes a first saw cutting process 710 that translates the cutting saw blade 700 along a first cut direction 701, for example, along the X direction as shown in FIGS. 7 and 7A. The first saw cutting process 710 cuts through portions of the package structure 600 and certain of the lead portions 102 of the respective device portions 101 along the first cut direction 701. The operation of the cutting saw blade 700 and the translation of the cutting saw blade 700 along the first cut direction 701 causes the cutting saw blade 700 to approach the first lateral side 131 of respective lead portions 102 and to depart from the opposite second lateral side 132 of the respective lead portions 102. As discussed previously, the first lateral side 131 of the respective lead portions 102 includes the first indent 121 along the bottom side 111 and the second lateral side 132 of the respective lead portions 102 includes the second indent 122 spaced apart from the bottom side 111 as shown in FIG. 7A.

The package separation by the cutting saw blade 700 heats the metal of the cut leads 102. One of the example first leads 102 is distorted by the cutting saw blade 700 translating along the first cut direction 701 while rotating. The distortion is due to heating of the cutting saw blade 700, in which the generated saw burr direction and the lead smear direction are opposite to the saw cutting direction. In the illustrated examples, the saw cut directions 701 and 801 are determined according to the lead design such that the cutting saw blade approaches a given lead 102 from the second side 132 with the second indent 122, and departs the given lead 102 at the first lateral side 131 having the first indent 121. In this example, the cutting process 710 creates a copper lead smear defect 702 along the lateral side, which is spaced apart from the adjacent lead 102 by a distance 703 along the first direction X. This example also has a saw burr 704 (e.g., excessive copper) remaining on the bottom side of the lead 102 after saw singulation. In this example, the saw burr is 704 spaced apart from the adjacent lead 102 by a distance 705 that is less than the distance 703.

The rhomboid shape of the lead portion profile along the cut line advantageously locates the first indent 121 of the adjacent lead facing the saw burr 704 so that the spacing distance 705 remains within the design specifications for the finished product and mitigates the change of short circuiting of adjacent leads 102 in the final packaged devices. In addition, the first indent 121 in the first lateral side of the leads 102 mitigates the change of the lead smear spacing distance 703 violating the design spacing specification and mitigates short circuiting of adjacent leads 102 in the finished product. In this regard, the rhomboid lead shape resulting from the first and second indents 121 and 122 in the lead portions 102 of the starting lead frame 100 mitigates these problems even where high heat generation during the sawing processes 710 and/or 810 causes ductile softening of the copper lead frame 100, and the design helps to ensure proper lead spacing even where the cutting saw blade 700 distorts the copper lead frame and/or shaves copper material to generate lead smears 702 or copper burrs 704.

The lead frame 100 including rhomboid lead profiles with the first and second indents 121 and 122 provides improved process margin for saw singulation. The rhomboid shape in these implementations reduces the lead width along the cutting face of the cutting saw blade 700 for lower copper loading during package separation at 210. Lower copper loading, in turn, generates less heat and reduces the sizes of any occurring saw burr and/or lead smear distortion. The benefits of the disclosed examples can be achieved alone or in combination with the use of hybrid saw blades to facilitate heat dispersion during saw singulation, using nozzles designed to introduce low temperature cutting water to cool the saw blade and the cutting point area to maintain a good sawing environment and/or reducing the starting thickness of the lead frame 100. Implementations of the disclosed indented, rhomboid lead profile shape, however, can improve the device lead separation distance and mitigate lead smears and saw burrs without the additional production cost and complexity impacts of these alternate approaches. In one example, the indents 121 and 122 are created by single side etching during lead frame fabrication to maximize the buffer zone between adjacent leads 102 within a given set of design spacing specifications.

Figure 8:
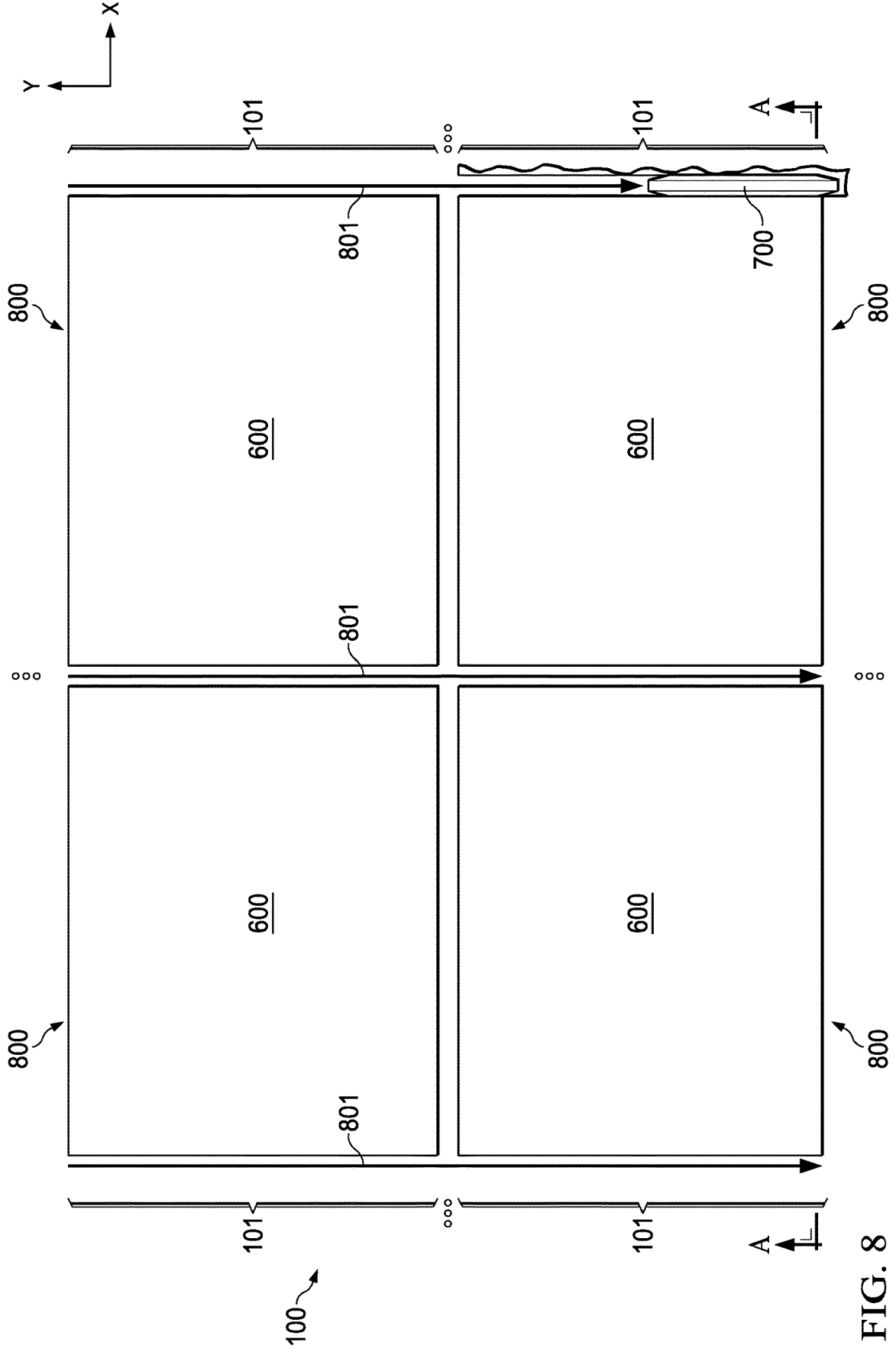
FIG. 8 is a partial top plan view of the lead frame with the package separation saw cutting portions of the molded structures and tie bar and lead features of the lead frame along a second direction.
Figures 8A, 10, 11, 12:
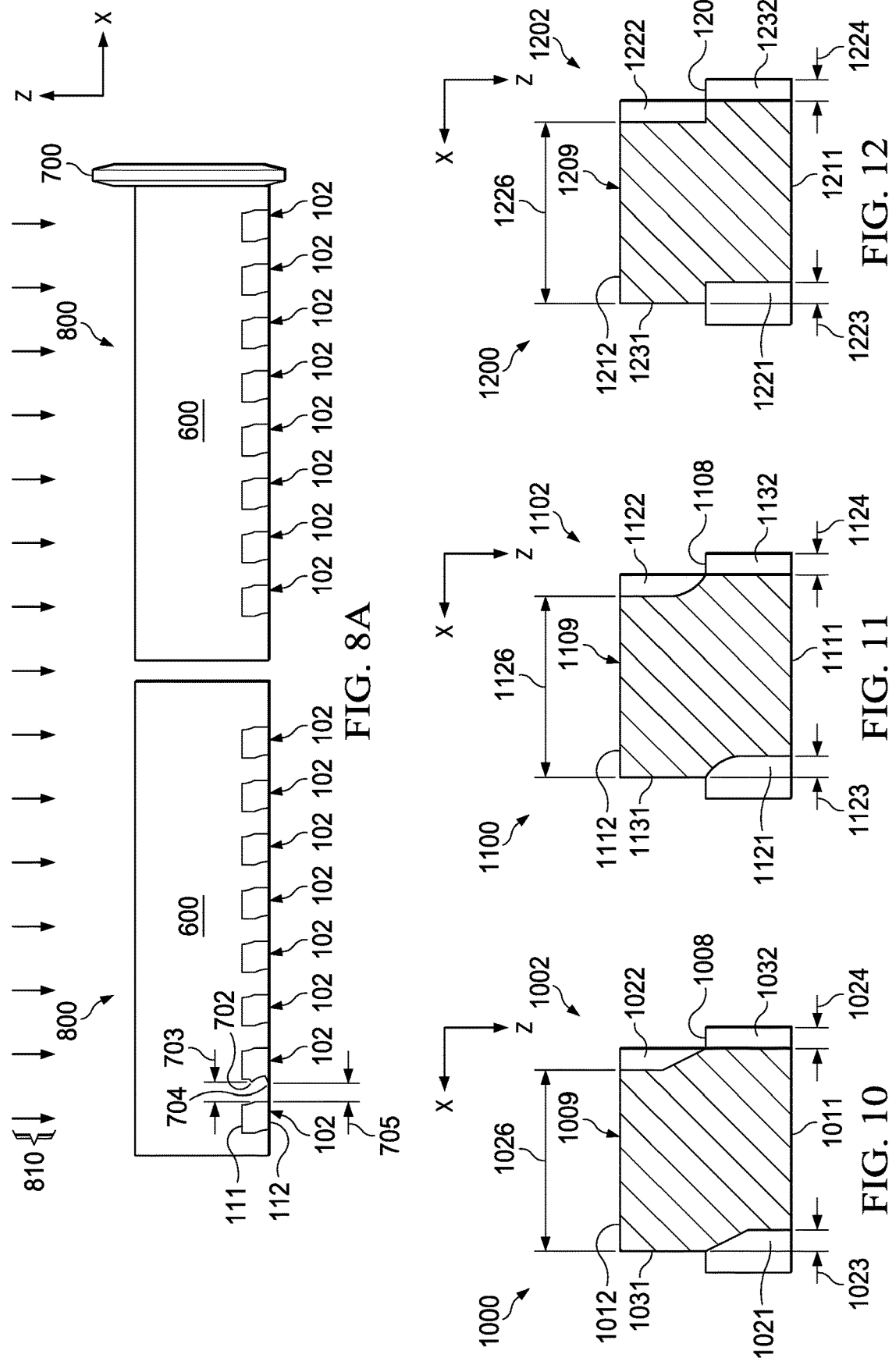
FIG. 8A is a partial sectional side elevation view of the lead frame taken along line A-A in FIG. 8 undergoing a second saw cutting process along the second direction to separate individual packaged electronic devices from one another.
FIG. 10 is a partial sectional side elevation view of another example lead frame according to another embodiment.
FIG. 11 is a partial sectional side elevation view of another example lead frame according to another embodiment.
FIG. 12 is a partial sectional side elevation view of another example lead frame according to another embodiment.

The package separation process at 210 also includes a second saw cutting process 810 shown in FIGS. 8 and 8A that separates individual packaged electronic devices 800 from one another. The second saw cutting process 810 cuts through second portions of the package structure 600 and second lead portions 102 of the respective device portions 101 along a second cut direction 801, for example, along the negative Y direction in FIGS. 8 and 8A. The second saw cutting process 810 causes the cutting saw blade 700 to approach the first lateral side 131 of respective second lead portions 102 and causes the cutting saw blade 700 to depart from the opposite second lateral side 132 of the respective second lead portions 102 that are arranged along the second (Y) direction as shown in FIGS. 8 and 8A. In the second lead portions 102 arranged along the Y direction, the first lateral side 131 includes the first indent 121 along the bottom side 111 of the lead frame 100 and the second lateral side 132 includes the second indent 122 spaced apart from the bottom side 111.

Figure 9:
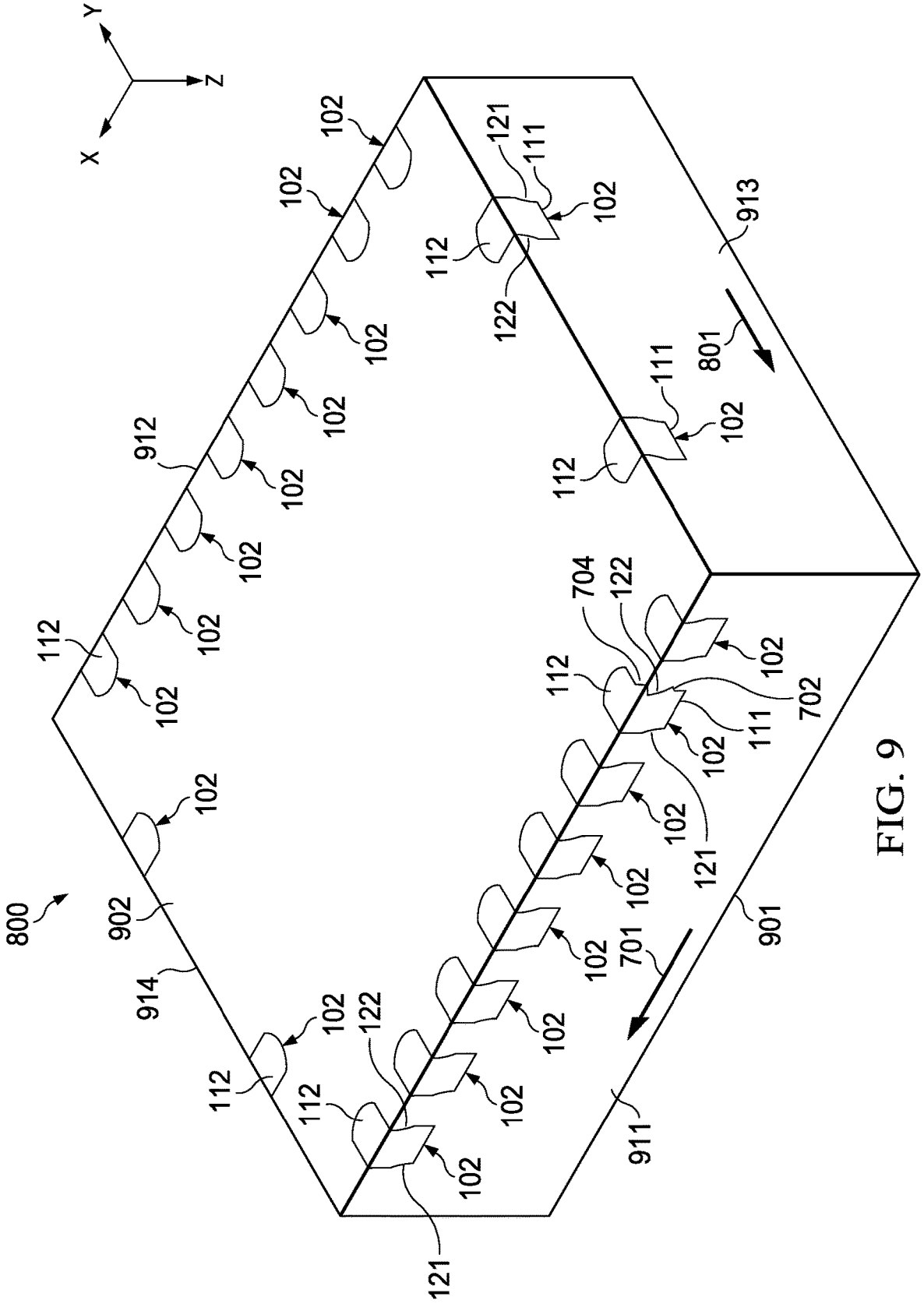
FIG. 9 is a perspective view of a packaged electronic device.

Referring also to FIG. 9, the separation resulting from the second saw cutting process 810 separates respective packaged electronic devices 800 from one another, one of which is shown in FIG. 9. The packaged electronic device 800 in this example is a QFN device with a package structure 600 having a first side 901, a second side 902, opposite first and second lateral sides 911 and 912, and opposite third and fourth lateral sides 913 and 914, respectively. The first saw cutting process 710 in FIGS. 7 and 7A cuts through portions of the package structure 600 and lead portions 102 along the first cut direction 701 to form the opposite first and second lateral sides 911 and 912 of the respective packaged electronic devices 800. The second saw cutting process 810 in FIGS. 8 and 8A cuts through the second portions of the package structure 600 and the second lead portions 102 of the respective device portions 101 along the second cut direction 801 to form the opposite third and fourth lateral sides 913 and 914 of the packaged electronic device 800.

The packaged electronic device 800 includes the semiconductor die 400 enclosed by the package structure 600, as well as the leads 102 having outwardly facing cut side surfaces created by the saw cutting processes. One or more of the finished leads 102 are electrically coupled to respective conductive features 401 of the semiconductor die 400. In the example QFN device 900, the first leads 102 are exposed along the first and second lateral sides 911 and 912 as well as on the bottom side 902. The second leads 102 are exposed along the respective third and fourth sides 913 and 914, as well as along the bottom side 902. The respective leads 102 have the first side 111, the second side 112, the first lateral side 131 and the opposite second lateral side 132. One or more of the leads 102 include the first indent 121 in the first lateral side 131 that extends to the first side 111, and the second indent 122 that extends to the second side 112 of the lead 102. In the illustrated example, the first indent 121 extends from the first side 111 and ends before the second side 112 of the first one of the leads 102. The second indent 122 extends from the second side 112 and ends before the first side 111 of the first one of the leads 102, and the first and second indents 121 and 122 have curved profiles.

FIGS. 10-12 show examples of other possible indent shapes and profiles. The indents can be formed using any suitable techniques, such as sawing, stamping, etching, etc. FIG. 10 shows a side view of a lead 1002 of another example lead frame 1000 according to another embodiment. The lead 1002 in this example includes half-etched ledge features 1008 and thicker features 1009. The lead 1002 also include a first indent 1021 that extends to a first side 1011 of the metal structure, and a second indent 1022 that extends to a second side 1012 of the metal structure. In one example, the first indent 1021 has a lateral width 1023 and the second indent 1022 has a lateral width 1024. In one example, the lateral widths 1023 and 1024 are approximately equal, such as about 25 μm, although not a requirement of all possible implementations. In another example, the lateral widths 1023 and 1024 are different. The lead 1002 has an upper width 1026, for example, about 240 μm. The lead 1002 has a first lateral side 1031 and an opposite second lateral side 1032. In this example, the indents 1021 and 1022 have substantially linear segments.

FIG. 11 shows a partial sectional side elevation view of another example lead frame 1100 according to another embodiment. The lead frame 1100 according to another embodiment. The lead 1102 in this example includes half-etched ledge features 1108 and thicker features 1109. The lead 1102 also include a first indent 1121 that extends to a first side 1111 of the metal structure, and a second indent 1122 that extends to a second side 1112 of the metal structure. In one example, the first indent 1121 has a lateral width 1123 and the second indent 1122 has a lateral width 1124. In one example, the lateral widths 1123 and 1124 are approximately equal, such as about 25 μm, although not a requirement of all possible implementations. In another example, the lateral widths 1123 and 1124 are different. The lead 1102 has an upper width 1126, for example, about 240 μm. The lead 1102 has a first lateral side 1131 and an opposite second lateral side 1132. In this example, the indents 1121 and 1122 have substantially linear segments as well as curved segments.

FIG. 12 shows a partial sectional side elevation view of another example lead frame 1200 according to another embodiment. The lead frame 1200 according to another embodiment. The lead 1202 in this example includes half-etched ledge features 1208 and thicker features 1209. The lead 1202 also include a first indent 1221 that extends to a first side 1211 of the metal structure, and a second indent 1222 that extends to a second side 1212 of the metal structure. In one example, the first indent 1221 has a lateral width 1223 and the second indent 1222 has a lateral width 1224. In one example, the lateral widths 1223 and 1224 are approximately equal, such as about 25 µm, although not a requirement of all possible implementations. In another example, the lateral widths 1223 and 1224 are different. The lead 1202 has an upper width 1226, for example, about 240 µm. The lead 1202 has a first lateral side 1231 and an opposite second lateral side 1232. In this example, the indents 1221 and 1222 have substantially linear segments.

The example leads 102, 1002, 1102 and 1202 provide rhomboid lead profiles to improve saw burr performance to meet latest automotive and other manufacturing specifications (e.g., 75 µm saw burr sizes or less) compared to rectangular lead profiles. The disclosed examples and other rhomboid lead implementations facilitate control of lead spacing specifications during manufacturing, and can be used in combination with higher saw cutting speeds, including faster blade rotational speed and/or higher linear saw translation speeds for a given lead frame thickness with the same or improved lead spacing quality to increase the productivity.

Modifications are possible in the described examples, and other implementations are possible, within the scope of the claims.

What is claimed is:

1. A lead frame, comprising:
a metal structure having a first side, an opposite second side, and prospective device portions arranged in rows that extend along a first direction and columns that extend along a second direction, the first direction being perpendicular to the second direction, the metal structure including tie bars joining the device portions;
the respective device portions including: a die attach pad connected to one of the tie bars, and leads spaced apart from the die attach pad, the respective leads have a first lateral side and an opposite second lateral side, the first and second lateral sides extending from one of the tie bars toward the die attach pad parallel to one of the first and second directions, a first one of the leads including a first indent in the first lateral side that extends to the first side of the metal structure wherein the first indent extends from the first side of the metal structure and the first indent ends before the second side of the metal structure, and the first one of the leads including a second indent that extends to the second side of the metal structure wherein the second indent extends from the second side of the metal structure and the second indent ends before the first side of the metal structure.

2. The lead frame of claim 1, wherein:
the first indent has a curved profile; and
the second indent has a curved profile.

3. The lead frame of claim 2, wherein each of the leads of the respective device portions includes the first indent in the first lateral side that extends to the first side of metal structure, and the second indent that extends to the second side of the metal structure.

4. The lead frame of claim 1, wherein the respective device portions include a row of the leads laterally outwardly spaced from each of four sides of the die attach pad.

5. The lead frame of claim 1, wherein the first one of the leads includes a half-etched ledge feature between the first side of the metal structure and the second side of the metal structure.

6. A packaged electronic device, comprising:
a package structure having a first side, a second side, and opposite first and second lateral sides;
a semiconductor die enclosed by the package structure;
leads exposed along the first and second lateral sides and electrically coupled to respective conductive features of the semiconductor die, the respective leads having a first side, a second side, a first lateral side and an opposite second lateral side, a first one of the leads including a first indent in the first lateral side that extends to the first side of the first one of the leads ends before reaching the second side of the first one of the leads, and the first one of the leads including a second indent that extends to the second side of the first one of the leads ends before reaching the first side of the first one of the leads.

7. The packaged electronic device of claim 6, wherein: the first indent has a curved profile; and the second indent has a curved profile.

8. The packaged electronic device of claim 6, wherein:
the first indent has a curved profile; and
the second indent has a curved profile.

9. The packaged electronic device of claim 6, wherein the package structure includes opposite third and fourth lateral sides; the packaged electronic device comprising leads exposed along the third and fourth lateral sides.

10. The packaged electronic device of claim 6, wherein the first one of the leads includes a half-etched ledge feature between the first side of the first one of the leads and the second side of the first one of the leads.

11. The packaged electronic device of claim 6, wherein an upper surface of the half-etched feature is non-linear.

12. The packaged electronic device of claim 6, wherein the first indent has a lateral width the same as a lateral width of the second indent.

13. The packaged electronic device of claim 6, wherein the first indent has a lateral width that is different than a lateral width of the second indent.

14. The packaged electronic device of claim 6, wherein the first indent in one of the first leads faces the second indent in an adjacent one of the first leads.

15. The packaged electronic device of claim 6, wherein the first indent and second indent have linear segments and curved segments.

16. A packaged electronic device, comprising:
a package structure having a first side, a second side, and opposite first and second lateral sides;
a semiconductor die enclosed by the package structure; and
one or more rhomboid shaped leads exposed along the first and second lateral sides and electrically coupled to respective conductive features of the semiconductor die, wherein the respective rhomboid shaped leads have a first side, a second side, a first lateral side and an opposite second lateral side, a first one of the rhomboid shaped leads including a first indent in the first lateral side that extends to the first side of the first one of the rhomboid shaped leads.

17. The packaged electronic device of claim 16, wherein the first one of the rhomboid shaped leads includes a second indent that extends to the second side of the first one of the rhomboid shaped leads.

18. The packaged electronic device of claim 16, wherein the first indent in the first lateral side that extends to the first side of the first one of the rhomboid shaped leads ends before reaching the second side of the first one of the rhomboid shaped leads.

19. The packaged electronic device of claim 18, wherein second indent that extends to the second side of the first one of the rhomboid shaped leads ends before reaching the first side of the first one of the leads.

20. The packaged electronic device of claim 16, wherein the first indent has a curved profile.

21. The packaged electronic device of claim 17, wherein the second indent has a curved profile.

22. The packaged electronic device of claim 21, wherein the first indent has a lateral width the same as a lateral width of the second indent.

23. The packaged electronic device of claim 21, wherein the first indent has a lateral width that is different than a lateral width of the second indent.

24. The packaged electronic device of claim 21, wherein the first indent in one of the first leads faces the second indent in an adjacent one of the first leads.

25. The packaged electronic device of claim 21, wherein the first indent and second indent have linear segments and curved segments.

* * * * *